United States Patent [19]

Sato

[11] 4,207,105

[45] Jun. 10, 1980

[54] PLASMA-ETCHING IMAGE IN EXPOSED AGX EMULSION

[75] Inventor: Masamichi Sato, Asaka, Japan

[73] Assignee: Fuji Photo Film Co., Ltd., Minami-ashigara, Japan

[21] Appl. No.: 814,943

[22] Filed: Jul. 12, 1977

Related U.S. Application Data

[63] Continuation-in-part of Ser. No. 652,697, Jan. 27, 1976, abandoned.

[30] Foreign Application Priority Data

Jan. 27, 1975 [JP] Japan .................................. 50-11110

[51] Int. Cl.² ................................................ G03C 5/00
[52] U.S. Cl. ..................................... 430/432; 156/643; 156/654; 156/655; 156/659; 204/192 E; 204/192 EC; 430/370; 430/942; 430/461; 430/430; 430/271; 430/275; 430/278; 430/306
[58] Field of Search .................. 96/36, 27 H, 35.1, 35, 96/50; 156/643, 654, 655, 659, 645; 204/192 E, 192 EC, 129.1

[56] References Cited

U.S. PATENT DOCUMENTS

| | | | |
|---|---|---|---|
| 3,576,630 | 4/1971 | Yanagawa | 96/36 |
| 3,615,956 | 10/1971 | Irving et al. | 156/645 |
| 3,639,125 | 1/1969 | Chand | 96/35 |
| 3,664,942 | 5/1972 | Havas et al. | 204/192 |
| 3,733,258 | 5/1973 | Hanak et al. | 204/192 E |
| 3,782,940 | 1/1974 | Ohto | 96/35.1 |
| 3,849,135 | 11/1974 | Karcikowski et al. | 96/36 |
| 3,860,783 | 1/1975 | Schmidt et al. | 204/192 E |
| 3,873,361 | 3/1975 | Franco et al. | 204/192 EC |
| 4,056,395 | 11/1977 | Sato et al. | 96/36 |

*Primary Examiner*—Edward C. Kimlin
*Attorney, Agent, or Firm*—Sughrue, Rothwell, Mion, Zinn and Macpeak

[57] ABSTRACT

A method for forming an image comprising forming a silver, silver halide or binder image in the emulsion layer of a photographic material, which photographic material comprises a support having a silver halide emulsion layer thereon, by exposing and developing the photographic material, and plasma etching the emulsion layer to preferentially remove the emulsion layer at the non-image areas. Alternatively, the emulsion layer may be on a masking layer, whereafter, following exposing and developing, the photographic material is plasma etched to preferentially remove the emulsion layer at the non-image areas and to uncover the masking layer lying thereunder and then the masking layer is etched away at the uncovered areas.

112 Claims, No Drawings

PLASMA-ETCHING IMAGE IN EXPOSED AGX EMULSION

CROSS-REFERENCE TO RELATED APPLICATION

This application is a continuation-in-part of application Ser. No. 652,697, filed Jan. 27, 1976; now abandoned.

BACKGROUND OF THE INVENTION

1. FIELD OF THE INVENTION

The present invention relates to a method for producing an image. More particularly, it relates to a method for producing a heat resistant, high contrast image having high resolving power using a photographic material which comprises a support having thereon at least one silver halide emulsion layer, either directly or on at least one subbing layer on the support. It also relates to a method for easily producing a durable photomask having high resolving power and good edge sharpness using a photographic material which comprises a support having a masking layer thereon, the masking layer having thereon at least one silver halide emulsion layer, either directly or on at least one subbing layer on the masking layer.

2. DESCRIPTION OF THE PRIOR ART

The optical density of a silver image formed in the emulsion layer of a photographic material which comprises a silver halide emulsion layer on a support by exposing and developing the photographic material gradually decreases from a maximum value to a background value at the edge of the silver image. The spacing between the maximum image density portion and the background is usually about 1 micron. Therefore, it is difficult to obtain a high contrast silver image having closely separated lines (about 1 micron) or spacings. Silver grains existing between adjacent image lines reduce the image contrast and resolving power.

Moreover, since such an emulsion layer is colored due to thermal decomposition of the binder when heated to about 150° to 200° C., it cannot be used for purposes requiring heat resistance.

One field which requires a heat resistant image is "super-microphotography". An image reduced on a 35 mm film from a 9 by 14 inch (23 by 36 cm) size original with a reduction ratio of about 10 is usually called a "microphotograph," and an image further reduced (about 2×3 mm) by a factor of about 10 is called a "super-microphotograph." A microphotograph can thus be considered to be an image reduced by a factor of about 10 and a super-microphotograph an image reduced by a factor of about 100.

Since the image size of a super-microphotograph is about 2 by 3 mm or smaller, the enlarging factor is about 100 (10,000 based on area ratio) when a super-microphotograph is projected on a screen to provide the original image size. Consequently, a light intensity of about 10 million lux is necessary on the image surface of the super-microphotograph if the image projected on a transmission type screen, e.g., with a blackened back surface, is to have a light intensity of 100 lux when the screen has a transmission optical density of 1. In fact, the super-microphotograph is illuminated with a light intensity of about 12 to 13 million lux to compensate for the loss of the projection lens. The temperature of the emulsion layer of the super-microphotograph increases to several hundred degrees C., due to the heat generated by the light absorbed by the emulsion layer, when it is continuously illuminated with such a strong light. As a result, the binder of the emulsion layer is thermally decomposed and colored to cause the image projected on the screen to be dim and colored. Since the silver image areas absorb light well, the temperature of these areas preferentially increases and the binder of these areas is preferentially decomposed, whereafter the decomposition spreads into the surrounding areas. Decomposition of the binder in even the non-silver image areas proceeds in an accelerated easily damaged, that is, durability is poor. On the other hand, a hard mask is quite durable, but the production thereof is complicated. Also, the production of a hard mask requires a photoetching process that uses a photoresist which has low sensitivity and requires long exposure times.

SUMMARY OF THE INVENTION

It is, therefore, one object of the present invention to provide a method for producing a heat resistant, high contrast image having high resolving power.

Another object of the present invention is to provide a method for easily producing a durable photomask having high resolving power and good edge acuity.

The first object of the present invention can be attained by exposing and developing a photographic material which comprises a support having thereon at least one silver halide emulsion layer, either directly or on at least one subbing layer, to form a silver image, silver halide image or binder image, the silver image then being intensified and/or toned, if desired, and then image-wise plasma etching away the emulsion layer to remove the non-image areas of the emulsion layer.

The second object of the present invention can be attained by exposing and developing a photographic material which comprises a support having a masking layer thereon, the masking layer having thereon at least one silver halide emulsion layer, either directly or on at least one subbing layer on the masking layer, to form a silver image, silver halide image or binder image, intensifying and/or toning the silver image, if desired, image-wise plasma etching away the layer or layers above the masking layer to remove the non-image areas of the emulsion layer and uncover the masking layer lying thereunder, and then etching away the masking layer at the uncovered areas.

DETAILED DESCRIPTION OF THE INVENTION

Some of the more important processing sequences which will be described in detail in the following specification are as follows.

First, by conventional exposure and development, and assuming a positive system (the modifications for a negative system will be appreciated by one skilled in the art), silver is formed in exposed areas and silver halide is formed in unexposed areas. In one embodiment of the present invention, the element can be fixed to provide exposed areas which comprise (silver plus binder) and unexposed areas which comprise (binder). In a further alternative, one can bleach the material to give (silver halide plus binder) areas and (binder) areas. In a further embodiment, one can form a (binder) image, for example, by bleaching a silver image with a bleaching solution containing potassium dichromate and sulfuric acid. The binder at the original (silver plus binder) areas is hardened by the bleaching, and the hardened binder is more resistant to plasma etching than non-hardened binder.

In the present invention, in general, the resistance of an image to plasma etching is in the following order:

(Ag or AgX) plus hardened binder<(Ag or AgX) plus non-hardened binder<hardened binder image If desired, the element can then be immediately plasma etched. In general embodiments, any (unhardened binder) area is preferentially removed by the plasma etching. However, any area which contains (silver plus binder) or (silver halide plus binder) or (hardened binder) is removed at a much slower rate by plasma etching, the support or masking layer being exposed under areas where only (binder) was present.

In another alternative, prior to plasma etching but after formation of (silver halide plus binder), (silver plus binder) or (hardened binder) areas, the element is baked. During baking, all binder (except hardened binder) is decomposed but it not substantially gasified. Accordingly, following baking one has (silver halide plus decomposed binder) and (decomposed binder) areas, (silver plus decomposed binder) and (decomposed binder) areas, or (hardened binder) and (decomposed binder) areas. If this element is plasma etched, (decomposed binder) areas are very quickly removed as compared to areas which contain (silver or silver halide plus the decomposed binder) or (hardened binder).

In the above embodiments where one forms (silver halide plus binder) and (binder) areas or (silver plus binder) and (binder) areas, the areas which contain (silver plus binder) or (silver halide plus binder) can be toned or intensified. Such a (toned or intensified plus binder) area is also resistant to plasma etching. If desired, such a (toned or intensified) element can also be baked and then plasma etched.

Following plasma etching, with photographic materials which comprise a masking layer a final image is formed in the masking material, and the masking material is image-wise etched. If desired, the resist can be removed. In those instances where no masking layer is present, one essentially has a final image following plasma etching.

In the following discussion, it should be understood that "image" areas generally include silver image areas, silver halide image areas or hardened binder image areas. In view of the varying resistance of such images to plasma etching as set forth above, however, most of the following discussion will deal with silver images or silver halide images in light of the greater ease of process control. It should be understood, however, that the present invention includes the use of hardened binder images.

One type of photographic material used in the present invention fundamentally comprises a support having thereon a silver halide emulsion layer. If desired, one or more subbing layers can be interposed between the support and the silver halide emulsion layer, for example, when the surface of the support is hydrophobic.

Another type of photographic material used in the present invention fundamentally comprises a support having thereon a masking layer and a silver halide emulsion layer. If desired, one or more subbing layers can be interposed between the masking layer and the silver halide emulsion layer.

A hard support such as glass, metal, porcelain, and the like, or a flexible support, can be used as the support of the present invention, depending on the desired end-use of the product. Further, a transparent or opaque support can be used.

Typical flexible supports include supports as are ordinarily used for photographic light-sensitive materials such as a cellulose nitrate film, a cellulose acetate film, a cellulose acetate butyrate film, a cellulose acetate propionate film, a polystyrene film, a polyethylene terephthalate film, a polycarbonate film, laminates thereof, a thin glass film, heat resistant high melting point polymers such as poly(pyromellitic acid-p-phenylenediamineimide), poly(p-oxybenzoate), poly(ethylene-2,6-naphthalate), polyamidoimide polymers as described in U.S. Pat. No. 3,554,984, polyimidoimine polymers as described in U.S. Pat. No. 3,472,815, etc., carbon fibers, and the like.

Typical hard supports include glass (e.g., silica glas, soda lime glass, borosilicate glass, barium glass, potash glass, etc.), ceramics (e.g., hard porcelain, e.g., alumina porcelain, titanium porcelain, beryllia porcelain, mullite porcelain, talc porcelain, spinel porcelain, zircon porcelain, ferrite porcelain, etc., soft porcelain such as fritted porcelain, Sevres porcelain or bone china, etc., earthenware, e.g., glazed and baked earthenware, etc., (earthenware is generally considered to slightly absorb water whereas porcelain does not absorb water), cermets, e.g., $Al_2O_3$-Fe, TiC-Ni, etc., silica, sapphire, metals (e.g., iron, copper, zinc, antimony, nickel, cobalt, aluminum, titanium, chromium, tungsten, molybdenum, gold, platinum, palladium, iridium, rhodium, ruthenium, zirconium, tantalum, hafnium, tellurium, a nickel-iron alloy, a nickel-chromium alloy, an aluminum-iron alloy, a chromium-iron alloy, a chromium-aluminum alloy, a copper-beryllium alloy, a cobalt-iron alloy, a silicon-gold alloy, a titanium-aluminum alloy, a cobalt-nickel alloy, a nickel-chromium-iron alloy, etc.), semi-metals such as silicon, germanium, etc., chalcogen glasses such as As-S-Ge, As-Se-Ge, Ge-S, etc., porcelain enamel (a metal covered with a glaze and then baked), metals having an oxide of the metal layer from thereon, graphite, and the like.

The support for a photomask must be transparent since transparency is a necessary condition for mask alignment, as is well known in the field of microelectronic processing.

The term "transparent support" as is used herein designates a support which comprises a substance capable of transmitting not less than 50%, preferably not less than 70%, of electromagnetic waves in the near-ultraviolet (e.g., about 2900 Å to 4000 Å) and visible light regions (e.g., about 4000 Å to 7500 Å).

A masking layer is provided by depositing a masking material on a support using a conventional vacuum deposition, sputtering, ion plating, chemical plating or the like. Suitable masking materials are metal oxides such as silicon oxide, chromium oxide, ferric oxide, magnetic iron oxide (iron (II)-iron (III) oxide), cuprous oxide, cupric oxide, nickel oxide, cobalt oxide, germanium oxide, cadmium oxide, titanium oxide, tantalum oxide, etc., metals such as chromium, aluminum, silver, copper, titanium, cobalt, tungsten, nickel, tellurium, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a nickel-chromium alloy, a nickel-cobalt alloy, a cobalt-iron alloy, a silicon-gold alloy, a titanium-aluminum alloy, a copper-beryllium alloy, etc., semi-metals such as silicon, germanium, etc., chalcogen glasses such as As-S-Ge, As-Se-Ge, Ge-S, etc., and mixtures of oxides of such metals on the metal such as chromium oxide on chromium, cobalt oxide on cobalt, silicon oxide on silicon, etc.

The masking material provides a masking effect, particularly to ultraviolet light, and is preferably selected from those materials which transmit visible light and absorb ultraviolet light.

The thickness of the masking layer cannot be set forth unequivocally since thickness varies depending upon the end-use thereof. However, in general, a thickness ranging from about $0.01\mu$ to about $10\mu$, preferably 0.07 $\mu$ to $1.5\mu$, is employed. If the thickness is too small, absorption of ultraviolet light is too small, while if the thickness is too large, the etching takes too long and side-etching occurs, which is not desirable. Since a metal or metal oxide possesses much greater mechanical strength than a photographic emulsion layer or the like, the masking layer renders the photomask (support plus image-wise masking layer) scratch resistant.

The subbing layer used in the present invention is a layer which intimately adheres to both the substrate and the silver halide emulsion layer, or to both the masking layer and the silver halide emulsion layer. When the substrate or the masking layer differs substantially in properties from the silver halide emulsion layer, two or more subbing layers can be employed which adhere well to the layer to which they are closest and, of course, to each other. Suitable subbing layers are gelatin, gelatin derivatives as later described for the water-soluble binder, albumin, casein, cellulose derivatives as later described for the water-soluble binder, starch derivatives, sodium alginate, polyvinyl alcohol, poly-N-vinyl pyrrolidone, acrylic acid copolymers as later described for the water-soluble binder, polyacrylamide, alcohol-soluble polyamide resins as described in Japanese Patent Publication 5509/64, a mixture of a cellulose ester and a polyester of terephthalic acid-glycols as described in Japanese Patent Publication 14503/68, a mixture of gelatin and nitrocellulose as described in Japanese Patent Publication 2597/69, compounds as described in Japanese Patent Publication 11616/71, homopolymers or copolymers of glycidyl (meth)acrylate as described in West German Patent 2,001,727, etc. Also, a subbing layer formed by providing a thin polyvinyl acetate layer (for example, at a thickness of about 0.1 to about $0.3\mu$) and bringing the surface into contact with an aqueous alkaline solution such as an aqueous solution of sodium hydroxide for saponification can be used. A suitable thickness for the subbing layer generally ranges from about 0.1 to about $0.5\mu$.

The silver halide emulsion used in the present invention is conventional and can be obtained by dispersing one or more silver halides in a water-soluble binder. Illustrative silver halides are silver chloride, silver bromide, silver iodide, silver chlorobromide, silver bromoiodide, silver chlorobromoiodide, mixtures thereof, etc. While any silver halide emulsion can be used, emulsions having silver halide grains smaller than about $0.1\mu$ are preferred to obtain higher resolving power. The grain size of the emulsion is not limited to such sizes as these are merely preferred. The weight ratio of silver halide to the water-soluble binder (dry weight) is preferably about 1:6 to 6:1, though this is also not limitative.

A most typical silver halide emulsion is an emulsion which contains about 90 mol % or more silver bromide (preferably containing not more than about 5 mol % silver iodide) and contains silver halide grains of a mean grain size of not more than about $1\mu$, in which the weight ratio of silver halide to the water-soluble binder is about 1:4 to about 6:1. Another example of a silver halide emulsion is an emulsion which contains about 90 mol % or more silver bromide (preferably containing not more than about 5 mol % silver iodide) and contains silver halide grains of a mean grain size of not more than about $0.1\mu$ (a so-called Lippmann emulsion), in which the weight ratio of silver halide to the water-soluble binder is about 1:4 to about 6:1. Another example of a silver halide emulsion is an emulsion which contains about 50 mol % or more (preferably 70 mol % or more) silver chloride and contains silver halide grains of a mean grain size of not more than about $0.1\mu$, in which the weight ratio of silver halide to the water-soluble binder is about 1:4 to about 6:1.

On the other hand, examples of water-soluble binders include gelatin, colloidal albumin, casein, cellulose derivatives (e.g., carboxymethyl cellulose, hydroxyethyl cellulose, etc.), saccharide derivatives (e.g., agar-agar, sodium alginate, starch derivatives, etc.), synthetic hydrophilic colloids (e.g., polyvinyl alcohol, poly-N-vinyl pyrrolidone, polyacrylic acid copolymers, polyacrylamide, derivatives thereof, etc.). If desired, a compatible mixture of two or more of these binder scan be used. Of these, a most preferred binder is gelatin which can be replaced, partly or completely, by a synthetic high molecular weight substance, by a gelatin derivative (prepared by processing gelatin with a compound having a group capable of reacting with the functional groups contained in the gelatin molecule (i.e., amino groups, imino groups, hydroxy groups or carboxy groups), or by a graft polymer prepared by grafting a molecular chain of some other high molecular weight substance onto the gelatin.

Suitable compounds for preparing gelatin derivatives are isocyanates, acid chlorides and acid anhydrides as described in U.S. Pat. No. 2,614,928, acid anhydrides as described in U.S. Pat. No. 3,118,766, bromoacetic acids as described in Japanese Patent Publication 5514/64, phenyl glycidyl ethers as described in Japanese Patent Publication 21845/67, vinyl sulfone compounds as described in U.S. Pat. No. 3,132,945, N-allylvinylsulfonamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Patent Publication 26845/67, acid esters as described in U.S. Pat. No. 2,763,639, alkanesulfones as described in British Pat. No. 1,033,189, etc.

Descriptions of suitable branched high molecular weight polymers to be grafted onto gelatin are given in U.S. Pat. Nos. 2,763,625, 2,813,767, and 2,966,884, Polymer Letters, 5, 595 (1967); *Phot. Sci. Eng.*, 9, 148 (1965); *J. Polymer Sci. A*-1, 9, 3199 (1971); and the like. Homopolymers or copolymers of compounds which are generally called vinyl monomers, such as acrylic acid, methacrylic acid, the ester, amide, and nitrile derivatives thereof, styrene, etc., can also be used for grafting onto gelatin.

Hydrophilic vinyl polymers having some compatibility with gelatin, such as homopolymers or copolymers of acrylic acid, acrylamide, methacrylamide, hydroxyalkyl acrylate, hydroxyalkyl methacrylate, etc., i.e., copolymers of these materials among themselves and copolymers of these materials with other comonomers, are particularly preferred.

The silver halide emulsion is advantageously optically sensitized with one or more known optical sensitizers such as the cyanine dyes and merocyanine dyes as described in U.S. Pat. Nos. 1,346,301, 1,846,302, 1,942,854, 1,990,507, 2,493,747, 2,739,964, 2,493,748, 2,503,776, 2,519,001, 2,666,761, 2,734,000 and 2,739,149, and British Pat. No. 450,958.

The silver halide emulsion can be exposed with electromagnetic radiation to which the silver halide emulsion is sensitive, e.g., visible, ultraviolet, electron beam, X-ray radiation, etc. With optically sensitized photographic light-sensitive materials, it is convenient to select radiation mainly having a wavelength corresponding to the optically sensitized region of the emulsion as the light for exposing the emulsion layer.

The emulsion is advantageously chemically sensitized with a salt of a nobble metal such as ruthenium, rhodium, palladium, iridium, platinum, etc., as described in U.S. Pat. Nos. 2,448,060, 2,566,245, and 2,566,263. Also, the emulsion can be chemically sensitized with a gold salt as described in U.S. Pat. No. 2,399,083.

The emulsion can be stabilized against fogging with a gold salt as described in U.S. Pat. Nos. 2,597,856, and 2,597,915. Furthermore, a thiopolymer as described in U.S. Pat. No. 3,046,129 can advantageously be incorporated in the emulsion to prevent fogging. In addition, the emulsion can be stabilized to prevent fogging with a mercury compound as described in U.S. Pat. No. 3,046,129, column 20, line 51 to column 21, line 3, triazoles, azaindenes, disulfides, quaternary benzothiazolium compounds, zinc salts and cadmium salts.

The emulsion can also contain light-absorbing dyes as described in U.S. Pat. Nos. 2,527,583, 2,611,696, 3,247,127, 3,260,601, etc., if desired.

The emulsion is advantageously hardened with a suitable hardening agent for hydrophilic colloids, such as formaldehyde or a like hardener; N-methylol compounds as described in U.S. Pat. Nos. 2,732,316 and 2,586,168; carbodiimide compounds as described in U.S. Pat. No. 3,091,537; halogen-substituted fatty acids (e.g., mucochloric acid, muchbromic acid, etc.); compounds having a plurality of acid anhydride groups; mmethane-sulfonic acid bisesters; dialdehydes or the sodium hydrogen sulfate adducts thereof such as $\beta$-methyl-glutaraldehyde bis(sodium hydrogen sulfite) addition products, bisaziridinecarboxyamides (e.g., trimethylenebis (1-aziridinecarboxyamide)); triazine derivatives (e.g., 2-hydroxy-4,6-dichloro-s-triazine, etc.); and the like.

The silver halide emulsion can be coated on the support or masking layer as it is or after adding a coating aid thereto as described in U.S. Pat. No. 3,046,129.

The silver halide emulsion layer is aboyt 0.3 $\mu$ to about 20 82 , preferably about 0.5 $\mu$ to about 5 $\mu$ thick and can be coated in one or more layers on the masking layer or in one or more layers on one or both surfaces of the substrate. When two layers of the silver halide emulsion are used on one surface of the support, the total thickness is less than about 20 $\mu$, preferably less than about 5 $\mu$, and when two layers are formed separately on both surfaces of the support, the total thickness is not more than about 40 $\mu$, preferably not more than about 10 $\mu$ (all on a dry basis). When a siliver halide emulsion is applied to both sides of the support, both emulsion can, of course, be subjected to processing in accordance with the present invention. The thickness of the emulsion layer can be suitably selected depending upon the end-use of the material manufactured.

If desired, a backing layer, an antihalation layer, an interlayer, an uppermost layer (e.g., a protective layer, etc.), and the like can be provided on the substrate, the masking layer or on the emulsion layer(s).

The formation of a silver image in the silver halide emulsion layer can be effected using conventional photographic processing, that is, by development processing the exposed emulsion layer and, if necessary, fixing. Conventional photographic processings including exposure, development, fixing, etc., which can be used are described in detail in "Techniques of Microphotography" *Kodak Data Book P-52*, Eastman Kodak Co., Rochester, N.Y.

Developing agents which can be used in the method of the present invention for forming silver images are those well known in the art, and include developing agents such as the di-hydroxybenzenes and the polyhydroxybenzenes (e.g., hydroquinone, 2-chlorohydroquinone, 2-bromohydroquinone, 2-isopropylhydroquinone, toluhydroquinone, 2-phenylhydroquinone, 2,3-dichlorohydroquinone, 2,5-dimethylhydroquinone, pyrogallol, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, o-(methylamino)phenol, p-(methylamino)-phenol, p-(diethylamino)-phenol, 2,4-diaminophenol, p-(benzylamino)phenol, etc.), ascorbic acid, the 1-aryl-3- aminopyrazolines (e.g., 1-(p-hydroxyphenyl )-3-aminopyrazoline, 1-(p-methyl-aminophenyl)-3-pyrazoline, 1- (p-aminophenyl)-3-pyrazoline, 1-(p-amino-m-methylphenyl)-3-aminopyrazoline, etc.), N-(p-hydroxyphenyl)-glycine, the compounds described as developing agents in C.E.K. Mees & T. H. James, *The Theory of the Photographic Process;* 3rd Edition, Chapter 13, Macmillan Co., New York (1966), L. F. A. Mason, *Photographic Processing Chemistry*, pp. 16–30, The Focal Press, London (1966), and mixtures thereof. The developer generally possesses a pH of not less than about 8, preferably about 8.5 to 12.5.

The developer can contain, if desired, various conventional additives such as an alkali agent (e.g., a hydroxide of an alkali metal or ammonia, a carbonate such as sodium carbonate, potassium borate, ammonium carbonate, etc., a borate such as sodium metaborate, ammonium metaborate, sodium tetraborate, potassium tetraborate, ammonium pentaborate, potassium pentaborate, etc., etc.), a pH adjusting agent or buffer (e.g., a weak acid or alkali such as acetic acid, boric acid, a salt thereof, etc.), a development promoting agent (e.g., pyridinium compounds and cationic compounds as described in U.S. Pat. Nos. 2,648,604 and 3,671,247, potassium nitrate, sodium nitrate, condensation products of polyethylene glycol and derivatives thereof as described in U.S. Pat. Nos. 2,533,990, 2,577,127, and 2,950,970, nonionic compounds such as polythioethers represented by compounds as described in British Pat. Nos. 1,020,033 and 1,020,032, pyridine, organic amines such as ethanolamine, benzyl alcohol, hydrazines, etc.), an antifogging agent (e.g., an alkali bromide, alkali iodide, nitrobenzimidazoles as described in U.S. Pat. Nos. 2,496,940 and 2,656,271, and mercaptobenzimidazole, 5-methylbenzotriazole, 1-phenyl-5-mercaptotetrazole, compounds for a rapid developing solution as described in U.S. Pat. Nos. 3,113,864, 3,342,596, 3,295,976, 3,615,522, and 3,597,199, thiosulfonyl compounds as described in British Pat. 972,211, phenazine-N-oxides as described in Japanese Patent Publication 41675/71, antifogging agents as described in Kagaku *Shashin Binran (Handbook of Scientific Photography)*, Vol. 2, pp. 29–47, Maruzen, Tokyo (1959), etc.), stain or sludge preventing agents as described in U.S. Pat. Nos. 3,161,513 and 3,161,514 or British Pat. Nos. 1,030,442, 1,144,481, and 1,251,558, a preservative (e.g., sulfite, an acid sulfite, hydroxylamine hydrochloride, a formaldehyde-hydrogen sulfite adduct, an ethanolamine-hydrogen sulfite adduct, etc.), a surface active agent, etc.

On the other hand, suitable fixing agents for the silver halide are the generally well known solvents for silver halides, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble sulfur-containing organic dibasic acid (e.g., ethylenebisthioglycolic acid, etc.), a water-soluble salt thereof (e.g., potassium ethylenebisthioglycolate, sodium ethylenebisthioglycolate, etc.), and mixtures thereof.

The fixing solution can contain, if desired, a preservative (e.g., a sulfite, a bisulfite, etc.), a pH-buffer (e.g., boric acid, a borate, etc.), a pH-adjusting agent (e.g., acetic acid, etc.), a chelating agent, and the like.

A silver image is formed in the exposed areas, and in the unexposed areas silver halide is removed by fixing while the binder in the silver halide emulsion layer in unexposed areas remains intact. Where the silver halide emulsion is a reversal type emulsion or where reversal processing is conducted, the binder layer remains in exposed areas, whereas a silver image is formed in the unexposed areas.

In the present invention, the term "non-silver image areas" or "non-silver halide image areas" (non-image areas) designates areas other than silver image areas or silver halide image areas (image areas). The terms "silver image areas" or "silver halide image areas" and "non-silver image areas" or "non-silver halide image areas" do not necessarily mean light exposed areas and light unexposed areas, respectively, whether the element is a positive or negative type element. Image areas and non-image areas do not necessarily designate images or non-images formed by silver or silver halide and, in some cases, they mean image areas or non-image areas formed by a binder.

Expanding upon the above with an exemplification, a silver halide image can be formed by a conventional reversal development. For example, a silver halide emulsion is exposed and developed, and then bleached with an aqueous solution containing potassium dichromate and sulfuric acid. Also, a silver halide image can be formed by converting a silver image to a silver halide image. For example, a silver image can be bleached with an aqueous solution containing potassium dichromate and hydrochloric acid to convert silver into silver halide. The binder in bleached areas is hardened, and is more resistant to plasma etching than unhardened binder in other areas.

A binder image can be formed, for example, by bleaching a silver image with an aqueous solution containing potassium dichromate and hydrochloric acid and then removing the silver halide formed by bleaching with a fixing solution.

The photographic material in which an image is formed is then plasma etched. The term "plasma etching" is used in the present specification and claims as it is defined in Somekh, S., *Introduction to Ion and Plasma Etching*, Journal of Vacuum Science and Technology, Vol. 13, No. 5 pp 1003–07 Sept/Oct 1976 incorporated herein by reference. The term designates the procedure of bombarding radicals in plasma against a substance so that the substance bombarded is removed wherein the etching is not attributed to a sputtering phenomena (i.e. ion etching) but a chemical reaction that converts the bombarded substance to a volatile compound. One example of plasma etching is a low temperature gas plasma etching. Low temperature gas plasma etching essentially signifies the use of a plasma at a temperature which does not damage the material being processed, i.e., a plasma at a temperature of about 200° C. or lower.

It should be clear from the principle of the present invention that the plasma etching technique used in the present invention is not limited to low temperature gas plasma. Any radical bombarding techniques developed in which the removal of the substance bombarded is attributed to a chemical reaction that converts the bombarded substance to a volatile compound can be employed. Low temperature plasma etching is only one example of the plasma etching of the present invention to preferentially remove non-image areas from the photographic material.

It has heretofore been known that gas plasma causes etching. However, until recently it has not been known that the rate at which non-silver image areas are plasma etched is greater than the rate of etching in image areas, and the discovery of this phenomenon is an important aspect of the present invention. In fact, it has been confirmed that when a coated surface of a photographic material (i.e., silver or silver halide image areas and a binder layer) is subjected to low temperature gas plasma etching, non-image areas are etched away while the image areas merely decrease in thickness at an extremely slow rate. Therefore, plasma etching is satisfactorily effected when the non-silver image areas are removed to uncover the underlying support while the image areas remain.

Plasma etching depends upon the plasma conditions (frequency, power, gas and gas pressure).

Methods and devices for plasma etching are, for example, described in Richard L. Bersin, "Automatic Plasma Machines for Stripping Photoresist," *Solid State Technology*, June 1970, 13 (6), pp. 39–45; Stephen M. Irving, "A Plasma Oxidation Process for Removing Photoresist Films", *Solid State Technology*, June 1971, 14 (6), pp. 47–51; U.S. Pat. No. 3,615,956; etc.

Generally used conditions for plasma etching are set out below. Suitable temperatures which can be used range from about room temperature (e.g., about 20° to 30° C.) to about 600° C., the upper limit thereof corresponding to the baking temperature described hereinafter.

The plasma etching for removing non-image areas of a silver halide emsulsion layer is preferably conducted in an oxygen containing gas which includes oxygen gas per se, a mixed gas of oxygen and a gas such as helium, argon, nitrogen, ammonium, a series of fluorocarbon (e.g., $CF_4$, $CCl_2F_2$), carbon tetrachloride, and mixtures thereof, and gases of oxygen atom containing compounds such as carbon dioxide. From economical and practical standpoint, air is preferred.

Suitable gas pressures for plasma etching range from about $10^{-3}$ to about 5 Torr.

Suitable frequencies for the voltage applied to the electrodes in plasma etching range from about 10 to about 30 MHz when an alternating current is employed.

As the present invention essentially involves the use of conventional gas plasma etching devices, no expanded discussion will be offered relative thereto as such can be used in the present invention without modification. Generally speaking, however, there are two types of electrodes which are used for gas plasma etching; one is similar to that utilized for sputtering and the other is similar to that utilized for RF heating (capacitive type and inductive type).

There is essentially no limitation on the high frequency power used for the plasma etching. In practice, on a commercial scale, high frequency power ranging from about 10 to about 1000 W is used, mainly because such is easily commercially available.

It has been found that if the emulsion layer is heated (hereafter the heating process is designated baking) to a high temperature before plasma etching, the binder is decomposed and the plasma etching time necessary to remove the emulsion layer at the non-image areas is greatly decreased.

Baking can be effected by heating in air or in any other gas such as oxygen, nitrogen, argon, helium, etc., or in a vacuum at temperature above about 150° C., preferably about 200 to about 600° C. When a vacuum is used, it is preferred that the degree of vacuum be from about $10^{-3}$ to about 10 Torr. If the baking temperature is lower than 120° C., the baking takes a long time, while if the temperature is higher than 600° C., the support might be deformed. The baking time is the time to decompose the binder and depends on the baking temperature. For instance, when the binder mainly comprises alkali treated gelatin at a thickness of about 2 μ, a baking time of 10 to 20 minutes at 250° C., or 2 to 3 minutes at 400° C., is sufficient. It has been found that by baking the rate of the plasma etching can be increased by a factor of about 2. While not to be construed as unduely limitative, the baking time range for most commercial materials will range from about 15 seconds to about 60 minutes, more commonly from 30 seconds to 30 minutes.

Plasma etching is completed when non-image areas are removed to uncover the support thereunder. The binder of the thus obtained image may be decomposed by the heat generated during the plasma etching, assuming that the initial baking temperature was low (for example, 300° C.). If the plasma power is low, the amount of heat generation is small, hence the binder is not always decomposed. In those embodiments when the binder is decomposed, plasma etching proceeds in a shorter period of time, whereas when the binder is not decomposed, plasma etching proceeds in a longer period of time. Both embodiments are within the invention.

The thus obtained image is heat resistant because no binder exists at the non-image areas. Further, it has been found that the smoothness of the edges and the contrast (and, therefore, the resolving power) of the image in comparison with the original silver image formed in the emulsion layer using known methods are greatly increased.

According to another embodiment of the present invention, the silver or silver halide image is intensified and/or toned using known methods before plasma etching. By intensification and/or toning (hereafter simply designated intensification), the silver image is converted to another material or other materials are added to the silver or silver halide image. As a result, it has been found that the rate of plasma etching at intensified silver or silver halide image areas in comparison with (unintensified) silver or silver halide image areas may be greatly decreased. If the rate of plasma etching at the image areas is small, the time range for plasma etching increases and, therefore, plasma etching is greatly simplified. In other words, the plasma etching time becomes non-critical. Intensification is used with a non-baked emulsion layer. Of course, when the primary baking temperature is low and the baking time is small (e.g., 150° C., 2 min.), the binder is not completely decomposed. In such a case, intensification can be used with a baked emulsion layer, i.e., if the baking temperature is low and the binder is still water-permeable, intensification can follow baking. However, such takes a longer intensifying time, and accordingly, is not convenient from a practical standpoint.

General methods for intensification are described in Pierre Glafkides, *Photographic Chemistry*, Vol. 1, pp 189–199 and Vol. 2, pp. 643–662, Fountain Press, London (1958). Suitable examples are mercury intensification, chromium intensification, copper intensification, lead intensification, uranium toning, selenium toning, sulfur toning, iron toning, nickel toning, cobalt toning, copper toning, vanadium toning, titanium toning, lead chromate toning, cadmium toning, noble metal toning, etc. Of these, vanadium toning, titanium toning, iron toning, nickel toning, cobalt toning, copper toning, rhodium toning, palladium toning, lead chromate toning and chromium intensification are most preferred, since the rate of plasma etching of the image toned or intensified by these methods is very small.

As a special example of the above-described embodiment, a silver image can be bleached with an aqueous solution containing a dichromate to harden the emulsion layer at the silver image areas. As a result, the rate of plasma etching of the image becomes small. This embodiment can be considered a special case of intensification or obtaining a hardened binder image. When hydrochloric acid is used with a dichromate, the silver image is converted to a (silver halide/ hardened binder) image, and when sulfuric acid is used with a dichromate, the silver image is converted to a (hardened binder) image.

The second object of the present invention can be attained by exposing and developing a photographic material which comprises a transparent support having a masking layer thereon, the masking layer having thereon at least one silver halide emulsion layer, either directly or on at least one subbing layer on the masking layer, to form a silver image, intensifying and/or toning the silver image, if desired, image-wise plasma etching away the layer or layers above the masking layer to remove the non-image areas of the emulsion layer and uncover the masking layer lying thereunder, and then etching away the masking layer at the uncovered areas. Baking as earlier described can, of course, be used with this embodiment.

The uncovered masking layer at the non-image areas can be removed by any conventional technique such as chemical etching, plasma etching or ion etching. The emulsion layer remaining at the image areas acts as a resist for chemical etching, plasma etching or ion etching. The plasma etching or ion etching of the masking layer is successfully conducted if the emulsion layer at the image areas still remains or just disappears when the masking layer is just removed by plasma etching or ion etching, whereas the plasma etching or ion etching is unsuccessful if the emulsion layer at the image areas is completely removed and the masking layer has not been completely removed by the plasma etching or ion etching. Therefore, a necessary requirement for the resist (the emulsion layer at the image areas) is that it must have a low plasma etching or ion etching rate. When the masking layer is made of a substance which is hard to remove by plasma etching or ion etching, such as chromium, this requirement is particularly important. Similar requirements apply to chemical etching.

Suitable examples of gas which can be used for plasma etching of the masking layer are gases containing halogen (e.g., $Cl_2$, $F_2$) or gases of halogenated compounds, particularly gases of chlorine and fluorine containing compounds (e.g., carbon tetrachloride, carbon tetrafluoride, Freon (trademark, e.g. $CHClF_2$, $CCl_2F_2$, $CCl_2F$—$CClF_2$), a mixture of carbon tetrachloride and air, a mixture of Freon and air and the like. For ion etching of the masking layer, any gas conventionally used for this purpose can be employed and the above mentioned gases, needless to say, can also be employed therefor.

Surprisingly, it has been discovered that the resolving power and contrast of the resist pattern obtained by the method of the present invention are remarkably increased in comparison with the original silver image. That is, the optical density of a silver image formed in the emulsion layer gradually decreases from its maximum value to a background value at the edge of the silver image, as a result, lines of about $1\mu$ are difficult to resolve. However, it has been found that even with such a silver image the resolving power and edge contrast of the resist pattern are increased by the method of the present invention.

More surprisingly, it has been discovered that any fringe which exists in the original silver image disappears by the treatment of the present invention. That is, when a contact exposure is conducted on a silver halide emulsion layer through a master having a high surface reflectance, such as a chromium mask, the resultant silver image sometimes has a fringe due to multiple reflection in the emulsion layer; however, the fringe disappears by the treatment of the present invention, possibly because the amount of silver in the fringe is so small as compared with that of the image that the binder at the fringe is preferentially removed. Since resolving power and contrast are remarkably deteriorated by the generation of fringe, these effects are very useful.

In the present invention the thickness of the resist layer (emulsion layer at image areas) is generally much larger than that of the masking layer, therefore, it is not always necessary that the plasma etching rate of the resist layer be smaller than that of the masking layer. For instance, when a chromium layer at a thickness of $0.1\mu$ is used as a masking layer and an emulsion layer at the image areas at a thickness of $3\mu$ is used as a resist, the plasma etching rate of the resist layer can be about 20 times of that of the masking layer. When removal of the masking layer is effected by plasma etching or ion etching, an intensification treatment as described is particularly important.

Methods and devices for ion etching are, for example, described in R. G. Wilson & G. R. Brewer, *ION BEAMS with Application to Ion Implantation*, pp. 317-335, John Wiley & Sons, (1973) and L. I. Maissel & R. Glang, *Handbook of Thin Film Technology*, pp. 7-49, 7-53, McGraw-Hill (1971). One example of ion etching is cathode sputtering. Other examples are etching by glow discharge and by RF discharge.

Chemical etching as is used in this invention involves etching with an etching solution. Etching is effected using methods as are conventionally employed for metals or metal oxides. Suitable etching solutions which can be used for chromium and chromium oxide ($Cr_2O_3$) include an aqueous solution of cerium ammonium nitrate (at a concentration of about 80 to 250 g/liter) and 60 to 70% perchloric acid (in an amount of about 20 to 80 ml/liter) with an etching time of about 15 seconds to 10 minutes at a temperature of about 15° to 40° C., or an aqueous solution of cerium (IV) sulfate (at a concentration of about 40 to 200 g/liter) and 98 wt% sulfuric acid (in an amount of about 20 to 100 ml/liter) with an etching time of about 20 seconds to about 10 minutes at a temperature of about 15° to 40° C., etc.; suitable etching solutions for iron oxide include an aqueous solution of hydrochloric acid (at a concentration of about 1 to 12 N) with an etching time of about 10 seconds to 4 minutes at a temperature of about 30 to about 60° C., etc.; suitable etching solutions for silicon dioxide include hydrofluoric acid in an aqueous solution (at a concentration of about 6 to 48% by weight) with an etching time of about 10 seconds to 1 minute at a temperature of about 15° to 40° C., a mixture of about 0.5 to 2 parts by volume of hydrofluoric acid (48% by weight aqueous solution) and about 6 to 24 parts by volume of ammonium fluoride (40% by weight aqueous solution) with an etching time of about 30 seconds to 5 minutes at a temperature of about 15° to 40° C., etc.; suitable etching solutions for nickel include an aqueous solution of ferric chloride (at a concentration of about 5 to 300 g/liter) with an etching time of about 1 to 5 minutes at a temperature of about 15° to 40° C., etc.; suitable etching solutions for titanium include an aqueous solution of hydrofluoric acid (at a concentration of about 5 to 40% by weight) with an etching time of about 20 seconds to 2 minutes at a temperature of about 20° to 40° C., etc.

After the uncovered masking layer is etched away, the emulsion layer can be swollen or dissolved for removal together with the silver, silver salt or compounds formed by the intensifying treatment, if desired, by simply immersing the same in a conventional removing solution as described hereinafter. The removal of binder, if present, can be effected using an alkali (e.g., an aqueous solution of sodium hydroxide or potassium hydroxide at a concentration of about 10 to 20% by weight at about 40° to 60° C. for about 2 to 10 minutes, etc.), an acid (e.g., concentrated sulfuric acid (98% by weight) at about 60 to 98° C. for about 5 to 10 minutes, or concentrated nitric acid (70% by weight) at about 60° to 95° C. for about 2 to 10 minutes, etc.) or a salt (e.g., an aqueous solution of sodium hypochlorite or potassium hypochlorite at a concentration of about 5 to 10% by weight at about 30° to 60° C. for about 2 to 10 minutes, etc.). The only substantial limitation on the binder removing solution is that is should not attack or dissolve the masking layer. See U.S. Pat. No. 3,567,447 for additional examples of binder removing solutions. The above materials can also be used to remove a baked binder area, but removal is much simpler with the case of an unbaked binder.

The method of the present invention is particularly effective for electron beam exposures. A gelatin silver halide emulsion layer becomes highly insulative in vacuum and, as a result, the emulsion layer is charged with electrons and subsequent electrons are deflected by the electrons accumulated on the emulsion layer, thus distorting the pattern to be obtained. However, in the present invention a conductive layer (e.g., a chromium layer) is present under the emulsion layer, and, accordingly, the emulsion layer is free from the electron charge problem described. Therefore, the method of the present invention is particularly effective for patterns requiring high accuracy such as IC patterns.

The following examples are given to illustrate the invention in greater detail. Unless otherwise indicated, all parts, percents, ratios and the like are by weight.

EXAMPLE 1

1,400 ml of a silver bromide emulsion (mean grain size of silver bromide: about $0.06\mu$) was prepared using 50 g of gelatin and 188 g of silver bromide in a conventional manner. To this emulsion was added 0.25 g of 4-methyl-2,3-diethoxathiazolocarbocyanine iodide to optically sensitize the emulsion to light of a wavelength of 510 m$\mu$ to 530 m$\mu$. Then, the emulsion was coated to provide a dry thickness of about $2.5\mu$ on a soda lime glass plate, and then dried to obtain a photographic light-sensitive material. This photographic light-sensitive material was image-wise exposed (exposed to light from a tungsten lamp through a green filter (Kodak Wratten No. 58B)) for 3 seconds. The light intensity on the green filter was about 1,000 lux (intensity of light just before reaching the green filter)) and developed in a developer having the following composition (24° C., 5 minutes), followed by fixing in a fixing solution having the following composition (24° C., 1 minute) to obtain a silver image.

| Developer | | |
|---|---|---|
| 1-Phenyl-3-pyrazolidone | 0.5 | g |
| Sodium Sulfite (anhydride) | 50 | g |
| Hydroquinone | 12 | g |
| Sodium Carbonate (monohydride) | 60 | g |
| Potassium Bromide | 2 | g |
| Benzotriazole | 0.2 | g |
| 1-Phenyl-5-mercaptotetrazole | 5 | mg |
| Phenazine-2-carboxylic Acid | 1 | g |
| Water to make | 1 | l |
| Fixing Solution | | |
| 70% Ammonium Thiosulfate Aqueous Solution | | ml |
| Sodium Sulfite (anhydride) | | g |
| Boric Acid | 8 | g |
| Glacial Acetic Acid | 16 | ml |
| Aluminum Sulfate | 10 | g |
| Sulfuric Acid (98%) | 2 | ml |
| Water to make | 1 | l |

After rinsing with water and drying, the photographic material was heated to 250° C. in air for 10 minutes, and it was then placed in a plasma etching apparatus (model "PLASMOD II"; made by TEGAL Corporation; the same apparatus was used in Examples 2–4, 5, 7–12, 14 and 17) to conduct plasma etching. The conditions of plasma etching were as follows:

| Frequency: | 13.56 MH$_2$ |
|---|---|
| High Frequency Power: | 70 W |
| Gas: | Oxygen |
| Gas Pressure: | ≃ 0.5 Torr. |
| Temperature: | Room Temperature (24° C.) |

About 9 minutes were required to completely remove the gelatin layer at non-silver image areas. The silver image remained in silver image areas without being completely etched away.

The thus obtained silver image was heat resistant (the image was not damaged when heated to 500° C.) and had a high resolving power ($1\mu$ lines were reproduced well).

EXAMPLE 2

The same procedures as described in Example 1 were followed except that the emulsion layer was heated in air at 400° C. for 3 minutes and the plasma etching took 8 minutes. The heat resistance, resolving power, edge smoothness and contrast of the thus obtained silver image were almost the same as in Example 1.

EXAMPLE 3

The same procedures as described in Example 2 were followed except that the silver image was toned before baking by immersion in aqueous solution of rhodium chloride (RhCl$_3$) at a concentration of 0.3% by weight for 2 minutes at 20° C. and that the silver chloride formed by the toning was reduced to silver using the developer in Example 1. The thus obtained image had better heat resistance, resolving power and image contrast than the image of Example 2.

EXAMPLE 4

The same procedures as described in Example 3 were followed except that the plasma etching was conducted for 15 minutes. Almost the same results as described in Example 3 were obtained.

EXAMPLE 5

The same silver halide emulsion as described in Example 1 was coated to provide a dry thickness of about $0.5\mu$ on a chromium layer of a thickness of about $0.1\mu$ which had been vacuum deposited on a soda lime glass plate of a thickness of 1.6 mm to obtain a photographic light-sensitive material. A silver image was formed in the emulsion layer of this photographic material in the same manner as described in Example 1 and then the photographic material was heated in air at about 400° C. for 2 minutes, and then subjected to plasma etching in the same manner as described in Example 1 except for using high frequency power of 100 W for 2 minutes.

The decomposed gelatin at the non-image areas was almost completely removed, whereas the emulsion layer at the image areas was decreased in thickness to about ⅓ of that before baking but not completely removed by plasma etching. The remaining emulsion layer at the image areas would not serve as a resist for chemical etching of the chromium layer. When the high frequency power of the plasma etching was reduced to 50 W (but kept otherwise as in Example 1), the emulsion layer at the image areas would function as a resist after 2 minutes of plasma etching.

On the other hand, when the silver image was toned by immersion in the following toning solution (25° C., 30 minutes) before plasma etching, a good resist was obtained after rinsing in water, drying and plasma etching of the photographic material as in Example 1 except for using high frequency power of 100 W for 2 minutes. Plasma etching as in Example 1 except for using high frequency power of 70 W for 4 minutes also provided a good results.

| Toning Solution | |
| --- | --- |
| A solution prepared by adding 40 ml of a 20% potassium ferricyanide aqueous solution to a 10 wt % Aqueous Solution of Titanium Sulfate | 100 ml |
| Saturated Aqueous Solution of Oxalic Acid | 25 ml |
| Glycerin | 50 ml |
| Saturated Aqueous Solution of Potassium Alum | 50 ml |
| Water to make | 1 l |

The composition of the etching solution for the chromium was as follows:

| Chromium Etching Solution | |
| --- | --- |
| Cerium Ammonium Nitrate | 164.5 g |
| 70% Perchloric Acid Aqueous Solution | 43 ml |
| Water to make | 1 l |

The etching time of the chromium layer was about 1 minute at 20° C.

EXAMPLE 6

The same silver halide emulsion as described in Example 1 was coated to provide a dry thickness of about 2 microns on a germanium layer of a thickness of about 0.1 micron which had been vacuum deposited on a glass plate of a thickness of 1.6 mm to obtain a photographic material. A silver image was formed in the emulsion layer of this photographic material in the same manner as described in Example 1, and then the silver image was toned by immersion in a toning solution having the following composition (20° C., 25 minutes).

| Toning Solution | |
| --- | --- |
| 20% Vanadium Oxalate Aqueous Solution | 50 ml |
| Saturated Oxalic Acid Aqueous Solution | 50 ml |
| Saturated Ammonium Alum Aqueous Solution | 50 ml |
| 20% Ferric Oxalate Aqueous Solution | 100 ml |
| Glycerin | 50 ml |
| 10% Potassium Ferricyanide Aqueous Solution | 10 ml |
| Water | 1 l |

After rinsing in water and drying, the photographic material was heated in air at 300° C. for 5 minutes, then plasma etching was conducted for 8 minutes in the same way as described in Example 1, and then sputter etching at the following conditions was conducted for about 10 minutes. The germanium masking layer at the non-image areas was completely removed, whereas the germanium masking layer at the image areas was not etched. The thus obtained photomask was durable.

| Conditions of Sputter Etching | |
| --- | --- |
| Apparatus: | Model "FP-46" made by Nippon Electric Varian Co., Ltd. (the same apparatus was used in Examples 13, 15 and 16) |
| Gas: | Argon |
| Gas Pressure: | $1.2 \times 10^{-2}$ Torr |
| High Frequency Power: | 500 W |

EXAMPLE 7

A silver image was formed on a photographic material as was used in Example 6, then bleached by immersion in the following bleaching solution (20° C., 5 minutes), and then toned by immersion in the following toning solution (20° C., 5 minutes).

| Bleaching Solution | |
| --- | --- |
| Potassium Ferricyanide | 10 g |
| Ammonia Water (28%) | 10 ml |
| Water | 200 ml |
| Toning Solution | |
| Ferric chloride | 1 g |
| Hydrochloric Acid (37%) | 4 ml |
| Water | 200 ml |

The silver image was converted into an image of iron (III) hexacyanoferrate and silver chloride. The thus formed silver chloride was reduced to silver using the developer as described in Example 1, and then the image was toned again using the toning solution and conditions as described in Example 6. After rinsing in water, drying, and baking as described in Example 6, substantially the same results as described in Example 6 were obtained. The resist was not damaged by plasma etching as in Example 1 for 15 minutes, and, in general, results similar to those obtained in Example 6 were obtained. This example also shows the use of longer plasma etching times.

EXAMPLE 8

The same procedures as described in Example 1 were followed except that the silver image was bleached by immersion in the following bleaching solution (20° C., 1 minute) before baking. The thus obtained image had better edge acuity than that of Example 1.

| Bleaching Solution | |
| --- | --- |
| Potassium Dichromate | 20 g |
| Hydrochloric Acid (37%) | 10 ml |
| Water to make | 1 l |

EXAMPLE 9

The same procedures as described in Example 5 were followed except that a masking layer which comprised a vacuum deposited chromium layer at a thickness of about 400 Å having thereon a vacuum deposited chromium oxide ($Cr_2O_3$) layer at a thickness of about 400 Å was used and the baking was conducted at about 250° C. for about 10 minutes.

Substantially the same results as were obtained in Example 5 were obtained.

EXAMPLE 10

The same photographic material as described in Example 5 (except that the dry thickness of the emulsion layer was $2\mu$) was image-wise exposed in the same manner as described in Example 1, and then developed with the developer of Example 1 followed by bleaching by immersion in the following bleaching solution (20° C., 1 minute) without fixing after the development.

| Bleaching Solution | |
| --- | --- |
| Potassium Dichromate | 100 g |

| -continued | |
|---|---|
| Bleaching Solution | |
| Sulfuric Acid (98%) | 50 ml |
| Water to make | 1 l |

After rinsing in water and drying, the photographic material was heated in air at about 300° C. for 10 minutes, then plasma etching as described in Example 1 was conducted, and then etching of the masking layer was conducted in the same way as described in Example 5. The photographic material was then immersed in an aqueous solution of about 10% sodium hypochlorite at 40° C. for 5 minutes to remove the remaining resist. The thus obtained photomask had a good edge acuity and high resolving power.

EXAMPLE 11

The same procedures as described in Example 1 were followed except that air was used instead of oxygen and the plasma etching was conducted for about 16 minutes.

Substantially the same results as in Example 1 were obtained, but the edge smoothness was slightly poorer than that obtained in Example 1.

EXAMPLE 12

The same procedures as described in Example 5 were followed except for coating a 0.2 to 0.3μ subbing layer having the following composition on the chromium masking layer using an immersion method and drying the subbing layer for 15 minutes at 130° C. prior to coating the silver halide photographic emulsion thereon.

Subbing Solution

A solution prepared by adding 0.45 g of nitrocellulose (nitrocellulose RS 1/8; made by Daicel Ltd.) and 10.0 g of acetone, while stirring, to a gelatin dispersion comprising:

| | | |
|---|---|---|
| Gelatin | 0.4 | g |
| Salicylic Acid | 0.12 | g |
| Methanol | 0.18 | g |
| Ethylene Chloride | 55.0 | g |
| Acetone | 15.0 | g |

Results similar to Example 5 were obtained.

EXAMPLE 13

The same photographic material as described in Example 5 was used except that a silicon masking layer at a thickness of about 2,000 Å (formed by RF sputtering) was used instead of the chromium masking layer. A silver image was formed in the emulsion layer of this photographic material in the same way as described in Example 1, and the assembly then heated in air at 400° C. for 5 minutes, and then subjected to the following low temperature oxygen plasma etching for 10 minutes. The emulsion layer at the non-image areas was removed and the silicon masking layer lying thereunder was uncovered. The uncovered silicon masking layer at the non-image areas was then etched away by the following low temperature $CF_4$ plasma etching for 5 minutes.

| Low Temperature Oxygen Plasma | |
|---|---|
| Gas Pressure: | 0.1 Torr |
| High Frequency Power: | 100 W |
| Frequency: | 13.56 MHz |
| Low Temperature $CF_4$ Plasma | |
| Gas Pressure: | 0.1 Torr |
| High Frequency Power: | 100 W |
| Frequency: | 13.56 MHz |

The thus obtained silicon mask was durable and had a good edge acuity.

EXAMPLE 14

The photographic material of Example 9 was exposed, developed and fixed to form a silver image in the same manner as described in Example 1. The photographic material was subjected to oxygen plasma etching for about 30 minutes under the conditions as described in Example 1. Both the emulsion layer and the chromium layer at the non-image areas were removed, whereas the emulsion layer at the image areas still remained.

The thus obtained chromium-chromium oxide mask resolved about 2 μ lines.

While the invention has been described in detail and with reference to specific embodiments thereof, it will be apparent to one skilled in the art that various changes and modifications can be made therein without departing from the spirit and scope thereof.

What is claimed is:

1. A method for producing an image comprising
   (a) forming a silver image in the emulsion layer of a photographic material which comprises a support having thereon at least one silver halide emulsion layer, either directly or on at least one subbing layer on the support, by exposing and developing said photographic material to form image and non-image areas,
   (b) heating the photographic material of about 150° C. to about 600° C. to decompose the binder of the layer or layers above the support, and
   (c) then plasma etching away the layer or layers above the support with an oxygen containing gas to remove the non-image areas of the emulsion layer from the support without completely removing the image areas of the emulsion layer from the support.

2. The method of claim 1, wherein said silver halide emulsion is an emulsion layer of silver chloride, silver bromide, silver iodide, silver chlorobromide, silver bromoiodide, silver chlorobromoiodide or a mixture thereof.

3. The method of claim 1, wherein said plasma etching is a low temperature gas plasma etching.

4. The method of claim 3, wherein said gas is air, oxygen, a gas of an oxygen-containing compound or a mixture of oxygen and a gas selected from the group consisting of helium, argon, nitrogen, ammonia, a fluorocarbon series compound, carbon tetrachloride or a mixture thereof.

5. A method for producing an image comprising:
   (a) forming a silver image in the emulsion layer of a photographic material which comprises a support having thereon at least one silver halide emulsion layer, either directly or on at least one subbing layer on the support, by exposing and developing said photographic material to form image and non-image areas;

(b) intensifying and/or toning said silver image at least once; and (c) then plasma etching away the layer or layers above the support with an oxygen containing gas to remove the non-image areas of the emulsion layer from the support without completely removing the image areas of the emulsion layer from the support.

6. The method of claim 5, wherein said silver halide emulsion layer is an emulsion layer of silver chloride, silver bromide, silver iodide, silver chlorobromide, silver bromoiodide, silver chlorobromoiodide or a mixture thereof.

7. The method of claim 5, further comprising heating the photographic material between step (b) and step (c) to decompose the binder of the layer or layers above the support prior to said plasma etching of step (c).

8. The method of claim 7, wherein said heating is at about 150° C. to about 600° C.

9. The method of claim 5, wherein said plasma etching is a low temperature gas plasma etching.

10. The method of claim 9, wherein said gas is air, oxygen, a gas of an oxygen containing compound, or a mixture of oxygen and gas selected from the group consisting of helium, argon, nitrogen, ammonia, a fluorocarbon series compound, carbon tetrachloride or a mixture thereof.

11. The method of claim 5, wherein said intensifying or toning is selected from the group consisting of mercury intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning.

12. A method for producing an image comprising:
(a) forming a silver image in the emulsion layer of a photographic material which comprises a support having thereon a masking layer of a metal, a metal oxide, a semi-metal, a chalcogen glass or a mixture thereof in a thickness ranging from about 0.01 microns to about 10 microns, said masking layer having thereon at least one silver halide emulsion layer, either directly or on at least one subbing layer on the masking layer, by exposing and developing said photographic material to form image and non-image areas;

(b) plasma etching away the layer or layers above the masking layer with an oxygen containing gas to remove the non-image areas of the emulsion layer and uncover the masking layer lying thereunder without uncovering the masking layer under the image areas; and (c) then plasma etching away the masking layer at the uncovered areas with a gas containing halogen gas or a gas of a halogenated compound.

13. The method of claim 12, wherein said silver halide emulsion layer is an emulsion layer of silver chloride, silver bromide, silver iodide, silver chlorobromide, silver bromoiodide, silver chlorobromoiodide or a mixture thereof.

14. The method of claim 12, further comprising heating the photographic material between step (a) and step (b) to decompose the binder of the layer or layers above the masking layer prior to said plasma etching of step (c).

15. The method of claim 14, wherein said heating is at about 150° C. to about 600° C.

16. The method of claim 12, wherein said plasma etching of step (b) is a low temperature gas plasma etching.

17. The method of claim 13, wherein said gas is air, oxygen, a gas of an oxygen containing compound or a mixture of oxygen and a gas selected from the group consisting of helium, argon, nitrogen, ammonia, a fluorocarbon series compound, carbon tetrachloride or a mixture thereof.

18. The method of claim 12, wherein said metal oxide is silicon oxide, chromium oxide, ferric oxide, iron (II)-iron (III) oxide, cuprous oxide, cupric oxide, nickel oxide, cobalt oxide, cadmium oxide, germanium oxide, titanium oxide, or tantalum oxide; said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, or a nickel-chromium alloy; said semi-metal is germanium or silicon; said chalcogen glass is As-S-Ge, As-Se-Ge, or Ge-S; and said mixture thereof is chromium-chromium oxide (chromium oxide on chromium) or silicon-silicon oxide (silicon oxide on silicon).

19. The method of claim 12, wherein said plasma etching of step (c) is a low temperature gas plasma etching.

20. The method of claim 12 further comprising removing the emulsion layer at the image areas to leave the masking layer thereunder.

21. The method of claim 20, wherein said removing of the emulsion layer at the image areas is by swelling or dissolving in a solution of an acid, an alkali or a salt.

22. A method for producing an image comprising:
(a) forming a silver image in the emulsion layer of a photographic material which comprises a support having thereon a masking layer of a metal, a metal oxide, a semi-metal, a chalcogen glass or a mixture thereof in a thickness ranging from about 0.01 micron to about 10 microns, said masking layer having thereon at least one silver halide emulsion layer, either directly or on at least one subbing layer on the masking layer, by exposing and developing said photographic material to form image and non-image areas;

(b) intensifying and/or toning said silver image at least once;

(c) plasma etching away the layer or layers above the masking layer with an oxegen containing gas to remove the non-image areas of the emulsion layer and uncover the masking layer lying thereunder without uncovering the masking layer under the image areas; and (d) then plasma etching away the masking layer at the uncovered areas with a gas containing halogen gas or a gas of a halogenated compound.

23. The method of claim 22, wherein said silver halide emulsion layer is an emulsion layer of silver chloride, silver bromide, silver iodide, silver chlorobromide, silver bromoiodide, silver chlorobromoiodide or a mixture thereof.

24. The method of claim 22, further comprising heating the photographic material between step (b) and step (c) to decompose the binder of the layer or layers above the masking layer prior to said plasma etching of step (c).

25. The method of claim 24, wherein said heating is at about 150° C. to about 600° C.

26. The method of claim 22, wherein said plasma etching of step (c) is a low temperature gas plasma etching.

27. The method of claim 26, wherein said gas is air, oxygen, a gas of an oxygen-containing compound or a mixture of oxygen and a gas selected from the group consisting of helium, argon, nitrogen, ammonia, a fluorocarbon series compound, carbon tetrachloride or a mixture thereof.

28. The method of claim 22, wherein said metal oxide is silicon oxide, chromium oxide, ferric oxide, iron (II)-iron (III) oxide, cuprous oxide, cupric oxide, nickel oxide, cobalt oxide, cadmium oxide, germanium oxide, titanium oxide, or tantalum oxide; said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, or a nickel-chromium alloy; said semi-metal is germanium or silicon; said chalcogen glass is As-S-Ge, As-Se-Ge, or Ge-S; and said mixture thereof is chromium-chromium oxide (chromium oxide on chromium) or silicon-silicon oxide (silicon oxide on silicon).

29. The method of claim 22, wherein said intensifying or toning is selected from the group consisting of mercury intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning.

30. The method of claim 22, wherein said plasma etching of step (d) is a low temperature gas plasma etching.

31. The method of claim 22 further comprising removing the emulsion layer at the image areas to leave the masking layer thereunder.

32. The method of claim 33, wherein said removing of the emulsion layer at the image areas is by swelling or dissolving in a solution of an acid, an alkali or a salt.

33. A method for producing an image comprising
(a) forming a silver halide image in the emulsion layer of a photographic material which comprises a support having thereon at least one silver halide emulsion layer, either directly or on at least one subbing layer on the support, by exposing and developing said photographic material and then bleaching the material to give said silver halide image and non-image areas,
(b) heating the photographic material at about 150° C. to about 600° C. to decompose the binder of the layer or layers above the support, and
(c) then plasma etching away the layer or layers above the support with an oxygen containing gas to remove the non-image areas of the emulsion layer from the support without completely removing the image areas of the emulsion layer from the support.

34. The method of claim 33, wherein said silver halide emulsion layer is an emulsion layer of silver chloride, silver bromide, silver iodide, silver chlorobromide, silver bromoiodide, silver chlorobromoiodide or a mixture thereof.

35. The method of claim 33, wherein said plasma etching is a low temperature gas plasma etching.

36. The method of claim 35, wherein said gas is air, oxygen, a gas of an oxygen containing compound, or a mixture of oxygen and a gas selected from the group consisting of helium, argon, nitrogen, ammonia, a fluorocarbon series compound, carbon tetrachloride or a mixture thereof.

37. A method for producing an image comprising
(a) forming a hardened binder image in the emulsion layer of a photographic material which comprises a support having thereon at least one silver halide emulsion layer, either directly or on at least one subbing layer on the support, by exposing and developing said photographic material and then bleaching the material to give said hardened binder image and non-image areas,
(b) heating the photographic material at about 150° C. to about 600° C. to decompose the binder of the layer or layers above the support, and
(c) then plasma etching away the layer or layers above the support with an oxygen containing gas to remove the non-image areas of the emulsion layer from the support without completely removing the image areas of the emulsion layer from the support.

38. The method of claim 37 wherein said silver halide emulsion layer is an emulsion layer of silver chloride, silver bromide, silver iodide, silver chlorobromide, silver bromoiodide, silver chlorobromoiodide or a mixture thereof.

39. The method of claim 37 wherein said plasma etching is a low temperature gas plasma etching.

40. The method of claim 39, wherein said gas is air, oxygen, a gas of an oxygen containing compound, or a mixture of oxygen and a gas selected from the group consisting of helium, argon, nitrogen, ammonia, a fluorocarbon series compound, carbon tetrachloride or a mixture thereof.

41. A method for producing an image comprising:
(a) forming a silver halide image in the emulsion layer of a photographic material which comprises a support having thereon at least one silver halide emulsion layer, either directly or on at least one subbing layer on the support, by exposing and developing said photographic material and then bleaching the material to give said silver halide image and non-image areas;
(b) intensifying and/or toning said silver halide image at least once; and
(c) then plasma etching away the layer or layers above the support with an oxygen containing gas to remove the non-image areas of the emulsion layer from the support without completely removing the image areas of the emulsion layer from the support.

42. The method of claim 41 wherein said silver halide emulsion layer is an emulsion layer of silver chloride, silver bromide, silver iodide, silver chlorobromide, silver bromoiodide, silver chlorobromoiodide or a mixture thereof.

43. The method of claim 41, further comprising heating the photographic material between step (b) and step (c) to decompose the binder of the layer or layers above the support prior to said plasma etching of step (c).

44. The method of claim 43 wherein said heating is at about 150° C. to about 600° C.

45. The method of claim 41 wherein said plasma etching is a low temperature gas plasma etching.

46. The method of claim 45 wherein said gas is air, oxygen, a gas of an oxygen containing compound, or a mixture of oxygen and a gas selected from the group consisting of helium, argon, nitrogen, ammonia, a fluorocarbon series compound, carbon tetrachloride or a mixture thereof.

47. The method of claim 41 wherein said intensifying or toning is selected from the group consisting of mercury intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning.

48. A method for producing an image comprising:
(a) forming a silver halide image in the emulsion layer of a photographic material which comprises a support having thereon a masking layer of a metal, a metal oxide, a semi-metal, a chalcogen glass or a mixture thereof in a thickness ranging from about 0.01 micron to about 10 microns, said masking layer having thereon at least one silver halide emulsion layer, either directly or on at least one subbing layer on the mashing layer, by exposing and developing said photographic material and bleaching the material to give said silver halide image and non-image areas;
(b) plasma etching away the layer or layers above the masking layer with an oxygen containing gas to remove the non-image areas of the emulsion layer and uncover the masking layer lying thereunder without uncovering the masking layer under the image areas; and
(c) then plasma etching away the masking layer at the uncovered areas with a gas containing halogen gas or a gas of a halogenated compound.

49. The method of claim 48, wherein said silver halide emulsion layer is an emulsion layer of silver chloride, silver bromide, silver iodide, silver chlorobromide, silver bromoiodide, silver chlorobromoiodide or a mixture thereof.

50. The method of claim 48, further comprising heating, the photographic material between step (a) and step (b) to decompose the binder of the layer or layers above the masking layer prior to said plasma etching of step (b).

51. The method of claim 50 wherein said heating is at about 150° C. to about 600° C.

52. The method of claim 48 wherein said plasma etching of step (b) is a low temperature gas plasma etching.

53. The method of claim 49, wherein said gas is air, oxygen, a gas of an oxygen containing compound, or a mixture of oxygen and a gas selected from the group consisting of helium, argon, nitrogen, ammonia, a fluorocarbon series compound, carbon tetrachloride or a mixture thereof.

54. The method of claim 48 wherein said metal oxide is silicon oxide, chromium oxide, ferric oxide, iron (II)-iron (III) oxide, cuprous oxide, cupric oxide, nickel oxide, cobalt oxide, cadmium oxide, germanium oxide, titanium oxide, or tantalum oxide; said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, or a nickel-chromium alloy; said semi-metal is germanium or silicon; said chalcogen glass is As-S-Ge, As-Se-Ge, or Ge-S; and said mixture thereof is chromium-chromium oxide (chromium oxide on chromium) or silicon-silicon oxide (silicon oxide on silicon).

55. The method of claim 48 wherein said plasma etching of step (c) is a low temperature gas plasma etching.

56. The method of claim 48 further comprising removing the emulsion layer at the image areas to leave the masking layer thereunder.

57. The method of claim 56 wherein said removing of the emulsion layer at the image areas is by swelling or dissolving in a solution of an acid, an alkali or a salt.

58. A method for producing an image comprising:
(a) forming a hardened binder image in the emulsion layer of a photographic material which comprises a support having thereon a masking layer of a metal, a metal oxide, a semi-metal, a chalcogen glass or mixture thereof in a thickness ranging from about 0.1 micron to about 10 microns, said masking layer having thereon at least one silver halide emulsion layer, either directly or on at least one subbing layer on the masking layer, by exposing and developing said photographic material and bleaching the material to give said hardened binder image and non-image areas;
(b) plasma etching away the layer or layers above the masking layer with an oxygen containing gas to remove the non-image areas of the emulsion layer and uncover the masking layer lying thereunder without uncovering the masking layer under the image areas; and
(c) then plasma etching away the masking layer at the uncovered areas with a gas containing halogen gas or a gas of a halogenated compound.

59. The method of claim 58 wherein said silver halide emulsion layer is an emulsion layer of silver chloride, silver bromide, silver iodide, silver chlorobromide, silver bromoiodide, silver chlorobromoiodide or a mixture thereof.

60. The method of claim 58, further comprising heating the photographic material between step (a) and step (b) to decompose the binder of the layer or layers above the masking layer prior to said plasma etching of step (b).

61. The method of claim 60, wherein said heating is at about 150° C. to about 600° C.

62. The method of claim 58, wherein said plasma etching of step (b) is a low temperature gas plasma etching.

63. The method of claim 59 wherein said gas is air, oxygen, a gas of an oxygen containing compound, or a mixture of oxygen and a gas selected from the group consisting of helium, argon, nitrogen, ammonia, a fluorocarbon series compound, carbon tetrachloride or a mixture thereof.

64. The method of claim 58 wherein said metal oxide is silicon oxide, chromium oxide, ferric oxide, iron (II)-iron (III) oxide, cuprous oxide, cupric oxide, nickel oxide, cobalt oxide, cadmium oxide, germanium oxide, titanium oxide, or tantalum oxide; said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, or a nickel-chromium alloy; said semi-metal is germanium or silicon; said chalcogen glass is As-S-Ge, As-Se-Ge, or Ge-S; and said mixture thereof is chromium-chromium oxide (chromium oxide on chromium) or silicon-silicon oxide (silicon oxide on silicon).

65. The method of claim 58 wherein said plasma etching of step (c) is a low temperature gas plasma etching.

66. The method of claim 58 further comprising removing the emulsion layer at the image areas to leave the masking layer thereunder.

67. The method of claim 66 wherein said removing of the emulsion layer at the image areas is by swelling or dissolving in a solution of an acid, an alkali or a salt.

68. A method for producing an image comprising:
(a) forming a silver halide image in the emulsion layer of a photograhic material which comprises a support having thereon a masking layer of a metal, a metal oxide, a semi-metal, a chalcogen glass or a mixture thereof in a thickness ranging from about 0.01 micron to about 10 microns, said masking layer having thereon at least one silver halide emulsion layer, either directly or on at least one subbing layer on the masking layer, by exposing and developing said photographic material and bleaching the material to give said silver halide and non-image areas;
(b) intensifying and/or toning said silver halide image at least once;
(c) plasma etching away the layer or layers above the masking layer with an oxygen containing gas to remove the nonimage areas of the emulsion layer and to uncover the masking layer lying thereunder without covering the masking layer under the image areas; and
(d) then plasma etching away the masking layer at the uncovered areas with a gas containing halogen gas or a gas of a halogenated compound.

69. The method of claim 68 wherein said silver halide emulsion layer is an emulsion layer of silver chloride, silver bromide, silver iodide, silver chlorobromide, silver bromoiodide, silver chlorobromoiodide or a mixture thereof.

70. The method of claim 68, further comprising heating the photographic material between step (b) and step (c) to decompose the binder of the layer or layers above the masking layer prior to said plasma etching of step (c).

71. The method of claim 70 wherein said heating is at about 150° C. to about 600° C.

72. The method of claim 68 wherein said plasma etching of step (c) is a low temperature gas plasma etching.

73. The method of claim 69 wherein said gas is air, oxygen, a gas of an oxygen containing compound, or a mixture of oxygen and a gas selected from the group consisting of helium, argon, nitrogen, ammonia, a flurocarbon series compound, carbon tetrachloride or a mixture thereof.

74. The method of claim 68 wherein said metal oxide is silicon oxide, chromium oxide, ferric oxide, iron (II)-iron (III) oxide, cuprous oxide, cupric oxide, nickel oxide, cobalt oxide, cadmium oxide, germanium oxide, titanium oxide, or tantalum oxide; said metal is chromium, aluminum, silver, titanium, cobalt, tungsten, tellurium, nickel, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a slicon-gold alloy, a titanium-aluminum alloy, a copper-beryllium alloy, a cobalt-iron alloy, a cobalt-nickel alloy, or a nickel-chromium alloy; said semi-metal is germanium or silicon; said chalcogen glass is As-S-Ge, As-Se-Ge, or Ge-S; and said mixture thereof is chromium-chromium oxide (chromium oxide on chromium) or silicon-silicon oxide (silicon-oxide on silicon).

75. The method of claim 68 wherein said plasma etching of step (c) is a low temperature gas plasma etching.

76. The method of claim 68 further comprising removing the emulsion layer at the image areas to leave the masking layer thereunder.

77. The method of claim 76 wherein said removing of the emulsion layer at the image areas is by swelling or dissolving in a solution of an acid, an alkali or a salt.

78. The method of claim 1 wherein said support is a material which transmits not less than 50% of electromagnetic radiation having a wavelength between about 2900 and 7500 Å;

79. The method of claim 1 wherein said support is a material which transmits not less than 70% of electromagnetic radiation having a wavelength between about 2900 and 7500 Å.

80. The method of claim 1 wherein said silver halide emulsion layer has a thickness between 0.3 and 20$\mu$.

81. The method of claim 33 wherein said support is a material which transmits not less than 50% of electromagnetic radiation having a wavelength between about 2900 and 7500 Å.

82. The method of claim 33 wherein said support is a material which transmits not less than 70% of electromagnetic radiation having a wavelength between about 2900 and 7500 Å.

83. The method of claim 33 wherein said silver halide emulsion layer has a thickness between 0.3 and 20$\mu$.

84. The method of claim 37 wherein said support is a material which transmits not less than 50% of electromagnetic radiation having a wavelength between about 2900 and 7500 Å.

85. The method of claim 37 wherein said support is a material which transmits not less than 70% of electromagnetic radiation having a wavelength between about 2900 and 7500 Å.

86. The method of claim 37 wherein said silver halide emulsion layer has a thickness between 0.3 and 20$\mu$.

87. The method of claim 5 wherein said support is a material which transmits not less than 50% of electromagnetic radiation having a wavelength between about 2900 and 7500 Å.

88. The method of claim 5 wherein said support is a material which transmits not less than 70% of electromagnetic radiation having wavelength between about 2900 and 7500 Å.

89. The method of claim 5 wherein said silver halide emulsion layer has a thickness between 0.3 and 20$\mu$.

90. The method of claim 41 wherein said support is a material which transmits not less than 50% of electromagnetic radiation having a wavelength between about 2900 and 7500 Å.

91. The method of claim 41 wherein said support is a material which transmits not less than 70% of electromagnetic radiation having a wavelength between about 2900 and 7500 Å.

92. The method of claim 41 wherein said silver halide emulsion layer has a thickness between 0.3 and 20μ.

93. The method of claim 12 wherein said support is a material which transmits not less than 50% of electromagnetic radiation having a wavelength between about 2900 and 7500 Å.

94. The method of claim 12 wherein said support is a material which transmits not less tha 70% of electromagnetic radiation having a wavelength between about 2900 and 7500 Å.

95. The method of claim 12 wherein said silver halide emulsion layer has a thickness between 0.3 and 20μ.

96. The method of claim 12 wherein said masking layer masks ultraviolet light.

97. The method of claim 48 wherein said support is a material which transmits not less than 50% of electromagnetic radiation having a wavelength between about 2900 and 7500 Å.

98. The method of claim 48 wherein said support is a material which transmits not less than 70% of electromagnetic radiation having a wavelength between about 2900 and 7500 Å.

99. The method of claim 48 wherein said silver halide emulsion layer has a thickness between 0.3 and 20μ.

100. The method of claim 48 wherein said masking layer masks ultraviolet light.

101. The method of claim 58 wherein said support is a material which transmits not less than 50% of electromagnetic radiation having a wavelength between about 2900 and 7500 Å.

102. The method of claim 58 wherein said support is a material which transmits not less than 70% of electromagnetic radiation having a wavelength between about 2900 and 7500 Å.

103. The method of claim 58 wherein said silver halide emulsion layer has a thickness between 0.3 and 20μ.

104. The method of claim 58 wherein said masking layer masks ultraviolet light.

105. The method of claim 22 wherein said support is a material which transmits not less than 50% of electromagnetic radiation having a wavelength between about 2900 and 7500 Å.

106. The method of claim 22 wherein said support is a material which transmits not less than 70% of electromagnetic radiation having a wavelength between bout 2900 and 7500 Å.

107. The method of claim 22 wherein said silver halide emulsion layer has a thickness between 0.3 and 20μ.

108. The method of claim 22 wherein said masking layer masks ultraviolet light.

109. the method of claim 68 wherein said support is a material which transmits not less than 50% of electromagnetic radiation having a wavelength between about 2900 and 7500 Å.

110. The method of claim 68 wherein said support is a material which transmits not less than 70% of electromagnetic radiation having a wavelength between about 2900 and 7500 Å.

111. The method of claim 68 wherein said silver halide emulsion layer has a thickness between 0.3 and 20μ.

112. The method of claim 68 wherein said masking layer masks ultraviolet light.

* * * * *